United States Patent [19]
Corisis et al.

[11] Patent Number: 6,046,496
[45] Date of Patent: Apr. 4, 2000

[54] CHIP PACKAGE

[75] Inventors: David Corisis; Walter Moden, both of Meridian, Id.

[73] Assignee: Micron Technology Inc, Boise, Id.

[21] Appl. No.: 08/964,091

[22] Filed: Nov. 4, 1997

[51] Int. Cl.$^7$ .................................................. H01L 23/28
[52] U.S. Cl. .......................... 257/675; 257/676; 257/706; 257/707
[58] Field of Search .................................... 257/666, 675, 257/676, 706, 707

[56] References Cited

U.S. PATENT DOCUMENTS

| | | | |
|---|---|---|---|
| 5,024,883 | 6/1991 | SinghDeo et al. | 428/323 |
| 5,172,213 | 12/1992 | Zimmerman | 257/796 |
| 5,378,924 | 1/1995 | Liang | 257/675 |
| 5,442,234 | 8/1995 | Liang | 257/675 |
| 5,483,098 | 1/1996 | Joiner, Jr. | 257/676 |
| 5,598,034 | 1/1997 | Wakefield | 257/706 |
| 5,714,799 | 2/1998 | Okumura | 257/676 |

*Primary Examiner*—David E. Graybill
*Attorney, Agent, or Firm*—Workman, Nydegger & Seeley

[57] ABSTRACT

The present invention relates to a heat management structure within a chip package that allows for heat rejection away from a chip but that avoids the prior art problems of thermal stresses caused by dissimilar thermal conductivities of a heat management structure and of creating a thermally unbalanced package due to disparate distribution of packaging plastic. In an embodiment of the present invention a package includes a chip, leads on the chip, a die attach, a downset, a packaging plastic, and an outer structure among others. The outer structure, downset, and die attach are together a substantially unitary article. Achieving a balanced package that substantially resists warpage and bowing during ordinary manufacture and ordinary use in the life of the package is accomplished by balancing packaging material width and the ability of the downset to resist warpage and bowing stresses. A substantial portion of the outer structure is exposed to the external part of the package in the surface which includes the packaging lower edge. Alternatively, the downset can include a part of the external boundary of the package such that exposure of the downset to the external portion of the package allows for additional heat rejection away from the chip in addition to the use of the outer structure.

35 Claims, 5 Drawing Sheets

CHIP PACKAGE

BACKGROUND OF THE INVENTION

1. The Field of the Invention

The present invention relates to packaging of microelectronic components. More particularly, the present invention relates to improved dissipation of heat produced by microelectronic components. Additionally, the present invention relates to balancing a chip package against warpage stresses. In particular, the present invention relates to a unitary heat sink that functions as both as a die-attach paddle and an outer ring of a chip package for heat rejection that extends to the outer boundary of the chip package. In the unitary heat sink, at least one opening therein exists between the die-attach paddle and the outer boundary of the chip package.

2. The Relevant Technology

Microelectronic packages are routinely packaged in plastic molding compounds in order to reduce cost and facilitate packaging operations. Because microelectronic devices produce appreciable amounts of heat that must be removed from the device in order to ensure proper function thereof, the issue of heat removal has become increasingly important. Where the power rating of the microelectronic device becomes significantly high, plastic encapsulation usually will be replaced with either ceramic or metallic encapsulation to facilitate heat rejection. However, ceramic or metallic encapsulation is more expensive than plastic encapsulation.

A heat sink can be attached directly to a die to serve a dual function of a die-attach paddle and a heat sink. Conventional techniques have been developed to rigidly attach a heat sink to a lead frame for an integrated circuit. Several problems occur in chip packaging. One problem that occurs in using a composite heat sink is that disparities between coefficients of thermal expansion can cause destructive stresses in a package as the package cycles through heating and cooling.

As chip packaging technology follows the lead of microelectronic circuit design miniaturization, a goal is to miniaturize the chip package size to be substantially the same size as the chip itself. Lead on chip (LOC) technology allows leads to come directly to the microelectronic device without the need for wire bonding, thus, the chip package can have a smaller dimension.

FIGS. 1a and 1b illustrate a prior art method of heat management in which at least two problems exist. In FIG. 1a, a semiconductor package 10, depicted in a top plan view, illustrates LOC technology where a lead 12 makes direct contact to a chip 14 without a bonding wire. When viewed in the cross-section view of FIG. 1b, package 10 reveals a die attach 16 and outer structure 18 that are substantially parallel to each other and that are connected by any of various methods such as welding or adhesive bonding. As package 10 runs through thermal cycles, because of dissimilarities in coefficients of thermal expansion between die attach 16, adhesive bonding, if any, and outer structure 18, destructive stresses are caused. It can also be seen that die attach 16, outer structure 18, and any adhesive bonding material therebetween encapsulated in a packaging plastic 26 may have antagonistic abilities to withstand thermal stresses. A first thickness 20 of packaging plastic 26 above chip 14, and a second thickness 22 of packaging plastic 26 below die attach 16 may cause package 10 to be thermally unbalanced such that warpage and bowing may occur while in use. Although conductive heat flow into outer structure 18 may be substantial at the interface between die attach 16 and outer structure 18, ultimate heat rejection from package 10 is poor because outer structure 18 is substantially encapsulated in packaging plastic 26 and packaging plastic 26 acts as a heat flow resistor.

FIGS. 2a and 2b illustrate prior art attempts to substantially equilibrate dissimilar stresses in packaging plastic 26 by making first thickness 20 and second thickness 22 substantially similar. Die attach 16 is downset away from outer structure 18 by a downset 24 such that first thickness 20 and second thickness 22 are substantially similar. It can be seen, however, that a second heat sink 34, substantially externally exposed at the package lower edge 28, is insulated from die attach 16 and outer structure 18 by packaging plastic 26. Packaging plastic 26 acts as a thermal blanket and resists heat removal from chip 14. Packaging plastic 26 may be required to be injected from at least two separate injection ports when a package such as package 10 depicted in either of FIGS. 1b and 2b is being assembled. Because die attach 16 and outer structure 18 may substantially seal packaging plastic 26 in the region that forms first thickness 20 from packaging plastic 26 in the region that forms second thickness 22, a dual-pressurized, dual injection-port plastic injection molding system may be needed to properly complete formation of the body of package 10.

FIG. 2c illustrates a cross-sectional view of an attempt to facilitate heat removal from chip 14 in which substantial downsetting of chip 14 to second heat sink 34 at package lower edge 28 is done wherein downset 24 extends downwardly substantially from the center line of package 10 to package lower edge 28. One problem with this structure is that first thickness 20 of packaging plastic 26 causes substantial unbalance such that warpage and bowing of package 10 is caused when package 10 is heated during ordinary use. Additionally, a two- or three-input injection-port molding technique is required.

What is needed in the art is a heat management structure that effectively conveys heat away from a microelectronic device without the problems that arise in the prior art.

More particularly, what is needed is a heat management structure that effectively rejects heat from a microelectronic device that avoids thermal stresses caused by dissimilarities in thermal conductivities of materials. What is also needed in the art is a method of forming a chip package comprising packaging plastic that simplifies injection molding techniques over the prior art. What is also needed in the art is a heat management structure that does not cause an unbalanced package to be formed such that warpage and bowing are substantially avoided.

SUMMARY OF THE INVENTION

The present invention relates to a heat management structure within a chip package that allows for heat rejection from a chip but that avoids the prior art problems of thermal stresses caused by dissimilar thermal conductivities of a heat management structure and of creating a thermally unbalanced package due to disparate distribution of packaging plastic.

In an embodiment of the present invention a package includes a chip, leads on a chip, a die attach, a downset, a packaging plastic, and an outer structure among others. The outer structure, downset, and die attach comprise a substantially unitary article that can be made by stamping, etching, ingot casting or metal powder molding or other such unitary-article forming processes known in the art.

The complete structure of the die attach, the downset, and the outer structure is preferably made from a single piece of material such as copper or a copper alloy. When the die attach, downset, and outer structure are made by stamping, the grain structure therein, after formation by stamping and the like, would have a substantially homogeneous microscopic appearance in all locations except where the downset begins next to the die attach and where the downset ends next to the outer structure.

Achieving a balanced package that substantially resists warpage and bowing during ordinary manufacture and ordinary use in the life of the package is accomplished by balancing the packaging material width with the ability of the downset to resist warpage and bowing stresses. Specific selection of materials such as the packaging material and the metal that comprises the die attach, downset, and outer structure will depend upon the specific application. The downset forms a first angle approximately with the plane of the die attach if it is substantially planar, and a second angle approximately with the plane of the outer structure if it is substantially planar with each of the respective structures. The first angle is greater than 180 degrees and the second angle is less than 180 degrees.

A substantial portion of the outer structure is exposed to the external part of the package in the surface comprising the packaging lower edge.

It can now be appreciated that a unitary structure will avoid destructive thermal cycling stresses caused by disparate coefficients of thermal expansion that are inherent in dissimilar material composites.

The length and width of the die attach may be made to be larger than the chip, substantially the same size as the chip, or smaller than the chip. Selection of a preferred die attach length and/or die attach width can be made when a specific application is employed and the heat dissipation requirements of the heat sink unit are matched to the heat output of the chip. The actual size of the die attach to the size of the chip could be balanced between sufficient ability to act as a die attach to substantially secure the chip, to substantially resist warpage and bowing, and to have sufficient ability to allow the chip to reject heat to the outer structure. The number of occurrences of the downset for a given heat sink unit may be selected according to a particular application of the present invention.

In yet another embodiment of the present invention, the downset comprises a part of the external boundary of the package. Exposure of the downset to the external portion of the package allows for additional heat rejection from the chip in addition to the use of the outer structure. The downset forms a first angle with the plane of the die attach, and a second angle with the plane of the outer structure.

An example of forming a chip package is presented in which a unitary heat sink structure is provided that has a first side and a second side. The heat sink structure has at least one opening therein to communicate from the first side to the second side. An integrated circuit structure such as a chip is connected to the first side of the unitary heat sink structure to form an exposed integrated circuit package. A packaging material is next prepared, made flowable, and mobilized by transfer injection molding or the like. The packaging material may be selected from such materials as thermoset plastics and the like. The exposed integrated circuit package is next placed into a mold and encapsulated by packaging material, whereby the packaging material substantially covers above and to the sides of the integrated circuit structure, the packaging material substantially fills the at least one opening, and the packaging material substantially fills below the second side of the unitary heat sink structure. The packaging material flows from the first side through the at least one opening to the second side.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

The present invention relates to a heat management structure within a chip package that allows for heat rejection from a chip but that avoids the prior art problems of thermal stresses caused by dissimilar thermal conductivities of a heat management structure and of creating a thermally unbalanced package due to disparate distribution of packaging plastic.

Figure 1A:
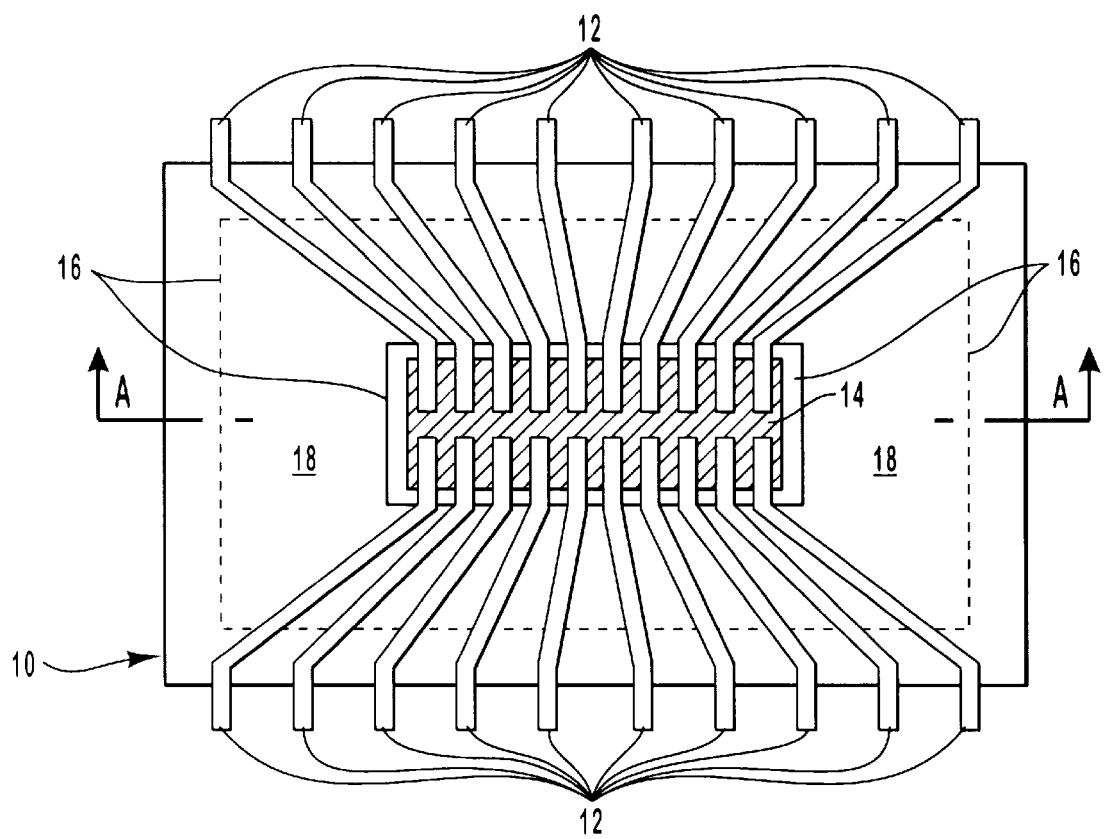
FIGS. 1a and 1b illustrate a prior art attempt to thermally manage a semiconductor package, wherein both a plan view as FIG. 1a and an elevational cross-section view as FIG. 1b are depicted.
Figure 1B:
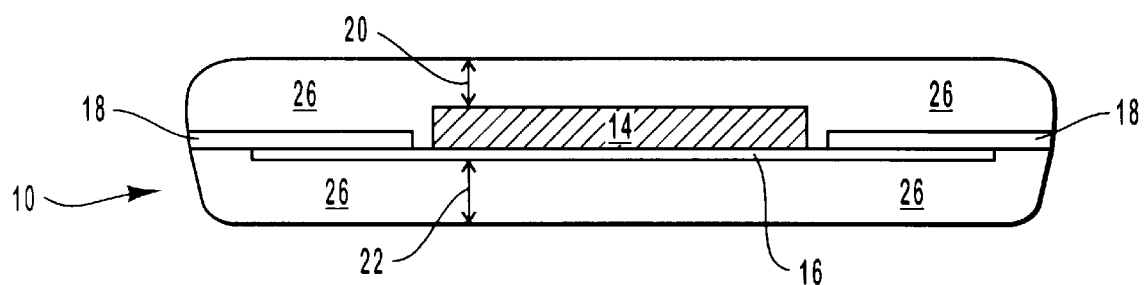
Figure 2A:
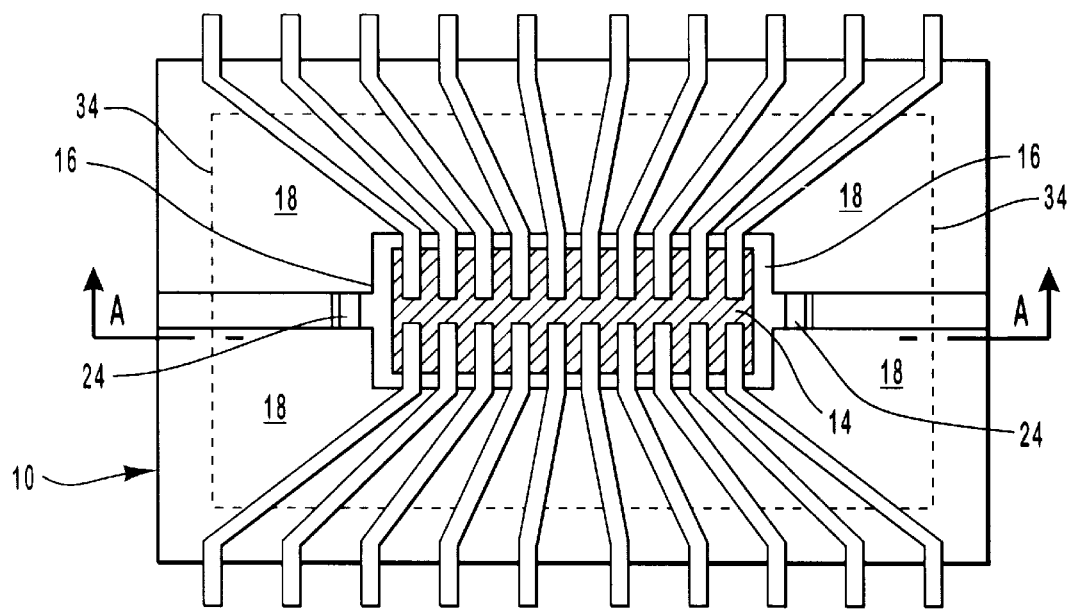
FIGS. 2a–2c illustrate other prior art attempts to solve thermal management problems, wherein a plan view, FIG. 2a, and two variations illustrated in elevational cross-section, FIGS. 2b and 2c respectively, are depicted wherein attempts to overcome thermal blanketing cause thermal structural instability.
Figure 2B:
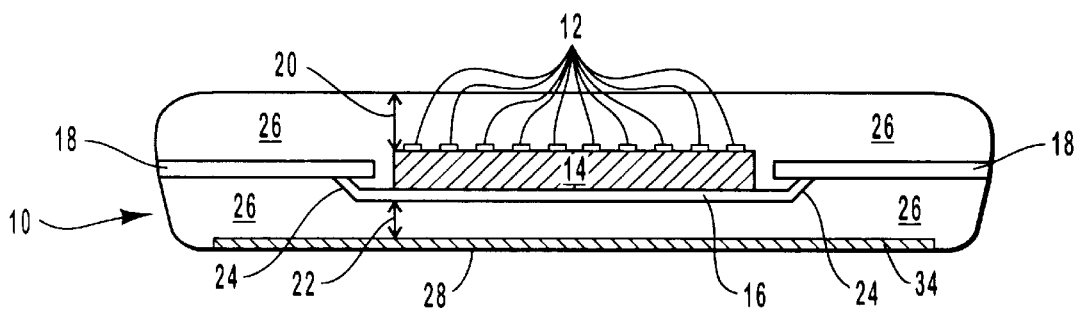
Figure 2C:
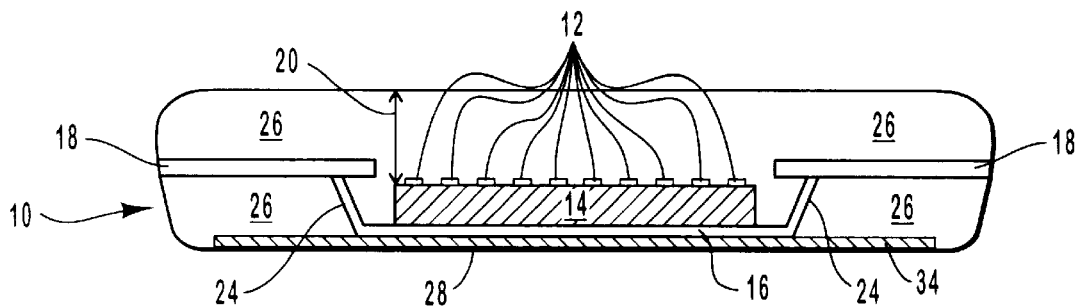
Figure 3A:
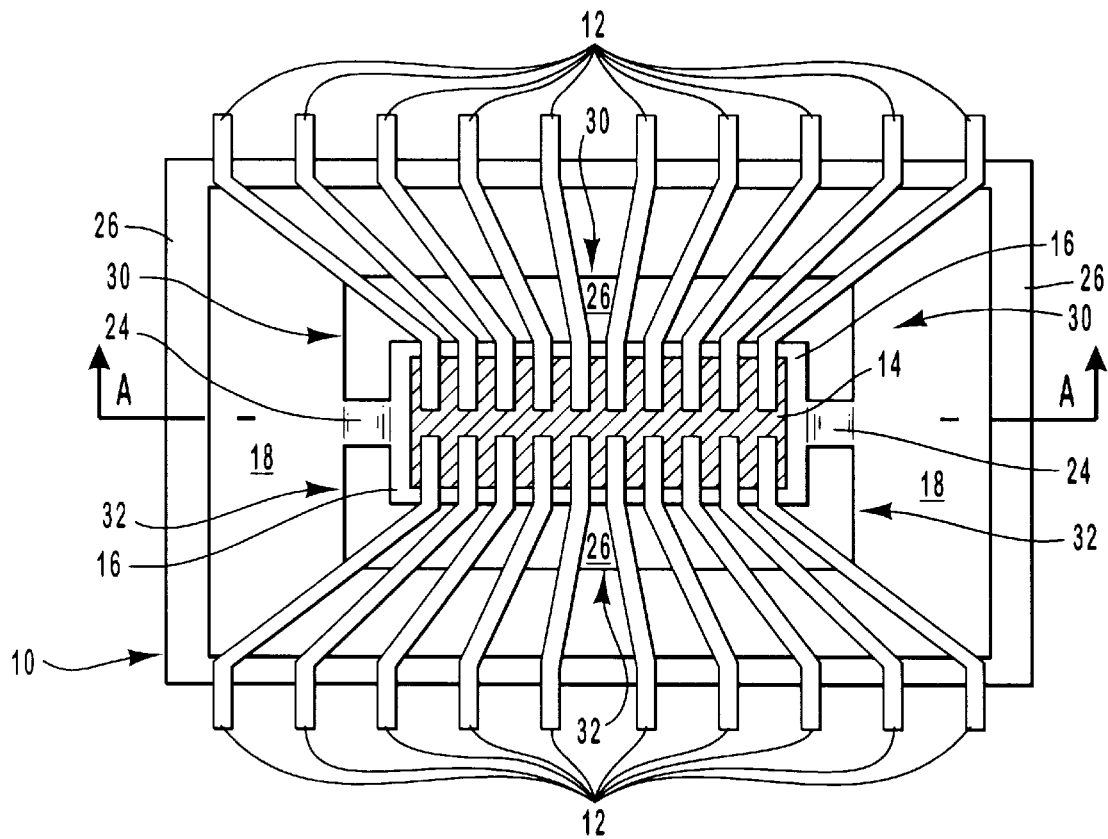
FIGS. 3a and 3b illustrate an embodiment of the present invention, viewed both in plan view, FIG. 3a, and elevational cross-sectional view, FIG. 3b, wherein a unitary die attach and outer structure or outer ring are depicted.
Figure 3B:
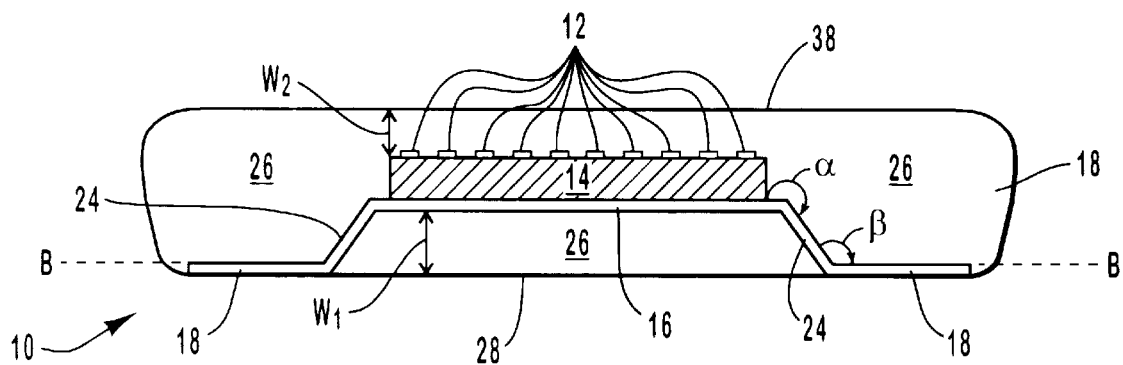

FIGS. 3a–3b illustrate an embodiment of the present invention wherein package 10 includes chip 14, leads on chip 12, die attach 16, downset 24, packaging plastic 26, and outer structure 18 among others. Outer structure 18, downset 24, and die attach 16 comprise a substantially unitary article that can be made by stamping, ingot casting, etching, metal powder molding, or other article forming processes known in the art.

FIG. 3a is a top plan view of package 10, depicted in a way such that packaging plastic 26 is substantially removed so as to topographically expose leads on chip 12, chip 14, die attach 16, downset 24, and outer structure 18. Package 10 is depicted after a fashion such that package 10 is "laid bare" down to a level as viewed in FIG. 3b, beginning at the level of a section line B—B but including the topology of outer structure 18, downset 24, die attach 16, chip 14, and leads on chip 12. In FIG. 3a, it can be seen that die attach 16, downset 24, and outer structure 18, although unitary, have openings therein comprising a first opening 30 and a second opening 32. First opening 30 and second opening 32, depicted as each being filled with packaging plastic 26, are formed to allow substantial flow of packaging plastic 26 therethrough while it is fluid and during formation of package 10.

FIG. 3b illustrates an elevational cross-section view of package 10 depicted in FIG. 3a taken along a section line A—A. When viewed in elevational cross section, the space made by first opening 30 or second opening 32 is seen as having an elevational opening of width $W_1$ that is substantially from the bottom of die attach 16 to package lower edge 28. Width $W_1$ allows for packaging plastic 26 to flow through first opening 30 and second opening 32 and to substantially fill the space between die attach 16 and package edge 28 as well as other regions of package not beneath die attach 16.

The complete structure of die attach 16, downset 24, and outer structure 18 may be made from a single piece of material such as an alloy. When die attach 16, downset 24, and outer structure 18 are made by stamping, the grain structure therein, after formation by stamping and the like, would have a substantially homogeneous microscopic appearance in all locations except where downset 24 begins next to die attach 16 and where downset 24 ends next to outer structure 18. Restoration of a uniformly homogeneous microscopic appearance may be done by annealing or the like.

In FIG. 3b, a second width $W_2$ is illustrated as being the thickness of packaging plastic 26 between the top of chip 14 and the package upper edge 38. Achieving a balanced package 10 that substantially resists warpage and bowing during ordinary manufacture and ordinary use in the life of package 10 is accomplished by balancing width $W_1$, second width $W_2$, and balancing therewith the ability of downset 24 to resist warpage and bowing stresses. Selection of materials such as packaging plastic 26 and the metal that comprises die attach 16, downset 24, and outer structure 18 will depend upon the specific application. For example, where chip 14 has a height substantially as illustrated in FIG. 3b, second width $W_2$ may be greater than width $W_1$, less than width $W_1$, or substantially equal to width $W_1$. Die attach 16 is illustrated as being a planar shape that projects substantially perpendicularly out of the plane of the page. Downset 24 forms a first angle, $\alpha$, with the plane of die attach 16, and a second angle, $\beta$, with the plane of outer structure 18, that also has a planar shape that projects substantially perpendicularly out of the plane of the page. The first angle is greater than 180 degrees and the second angle is less than 180 degrees.

Alternatively, downset 24 may have a step height that is less than one half the overall cross-sectional height of package 10, substantially one half the cross-sectional height of package 10, or substantially greater than one half the cross-sectional package height.

It can be seen in FIG. 3b that the unitary article comprising outer structure 18, downset 24, and die attach 16 has a substantial portion of outer structure 18 that is exposed to the external part of package 10 in the surface comprising the package lower edge 28. In particular, package lower edge 28 includes substantially all of outer structure 18 such that heat transferred from die attach 16 through downset 24 can be conveyed away from package 10 through outer structure 18 by conduction, convection, and/or radiation.

It can now be appreciated that a unitary structure will avoid destructive thermal cycling stresses caused by disparate coefficients of thermal expansion that are inherent in dissimilar material composites. It can now also be appreciated that the achievement of a thermally balanced package can be accomplished for a given size and energy rating of chip 14 by balancing width $W_1$ and second width $W_2$ such that warpage and bowing during ordinary manufacture and ordinary use in the life of the package is avoided.

Because metal stamping may cause weakening of the metal grain at the interface between die attach 16 and downset 24 and at the interface between downset 24 and outer structure 18, formation of a unitary article as set forth herein may be carried out by ingot casting or by metal powder molding. Additionally, where stamping and thermal cycling may cause metal fatigue at the aforementioned interfaces, an annealing operation may be carried out to substantially restore the integrity of a preferred grain structure at the interfaces as set forth above when the metal thereof is amenable to annealing operations.

FIGS. 4 and 5 illustrate structure embodiments of a heat sink unit 36 that comprises die attach 16, downset 24, and outer structure 18. Heat sink unit 36 may be made from specific compositions that are preferred for a specific application. Heat sink unit 36 may be made from materials including copper and copper alloys when copper contamination into the die is avoidable or is not problematic. Heat sink unit 36 may be made from aluminum, doped aluminum, or aluminum alloys when incidental oxidation of a film of aluminum is avoidable or is not problematic. A heat sink may be made from silver or silver alloys when incidental cost is not a concern or is not a substantial economic factor. Additionally, a heat sink may be made from titanium, titanium alloys, titanium aluminide intermetallics, and mixtures thereof.

Figure 4A:
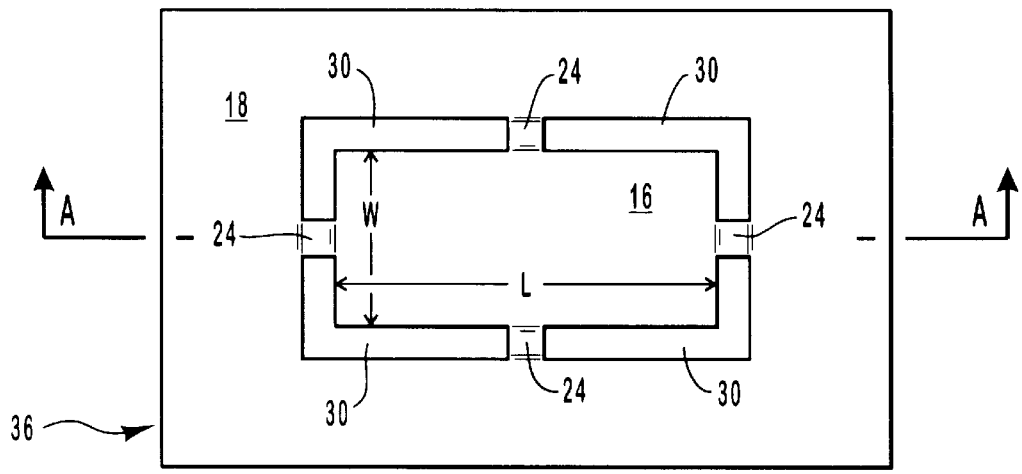
FIGS. 4a–4b illustrate an embodiment of the present invention, viewed both in plan view, FIG. 4a, and in elevational cross-section view, FIG. 4b, wherein a plurality of downsets are depicted that allow for increased conductive heat transfer from the die attach portion to the outer ring portion.

FIG. 4a is a top plan view of heat sink unit 36 of the present invention when viewed without chip 14 or packaging plastic 26, etc. It can be seen that downset 24 occurs four times in heat sink unit 36. All openings, such as first opening 30 seen in FIG. 3a are referred to in FIGS. 4a–4b and hereinafter, as opening 30 unless noted otherwise. A description of heat sink unit 36 can be followed in FIG. 4a by choosing any one of the four illustrated openings 30 and, moving either clockwise or counterclockwise, observing a first opening through a fourth opening, each being labeled with reference numeral 30. By proceeding in the same chosen direction, a first downset through a fourth downset are observed, each being labeled with reference numeral 24. The first downset is substantially opposite the third downset across from die attach 16 and the second downset is substantially opposite the fourth downset across from die attach 16. The first opening defines an opening between outer structure 18, die attach 16, the first downset, and the second downset. The second opening defines an opening between outer structure 18, die attach 16, the second downset, and the third downset. The third opening defines an opening between outer structure 18, die attach 16, the third downset, and the fourth downset. Finally, the fourth opening defines an opening between outer structure 18, die attach 16, the fourth downset, and the first downset.

The area defined within a length, L, and a width, W, of die attach 16 may be made to be larger than that defined by chip 14, substantially the same size as that defined by chip 14, or smaller than that defined by chip 14. Selection of a preferred die attach length L and/or die attach width W can be made when a specific application is employed and the heat dissipation requirements of heat sink unit 36 are matched to the heat output of chip 14. By way of non-limiting example, when chip 14 has a relatively low heat output, the area defined by die attach length L and die attach width W may be substantially larger than that defined by chip 14. In such an application, it is assumed that heat management requirements of heat sink unit 36 are relatively low and the outer dimensions of heat sink unit 36 match some standard dimension for each in an array of chip packages. When chip 14 has a relatively high heat output, the area defined by die attach length L and die attach width W may be smaller than that defined by chip 14. In such an application, it is assumed that heat management requirements of heat sink unit 36 are relatively high and, like a package with a low heat output, the outer dimensions of heat sink unit 36 substantially match some standard dimension for each chip package in an array of chip packages. In a high heat-flow management application, it is preferred that more of heat sink unit 36 is exposed externally as part of package 10 (not shown) in the form of outer structure 18. Thus, die attach 16 could be relatively smaller than it may occur in a low heat management application, downset 24 could have as few as one occurrence or as many occurrences as the number of leads 12 on chip 14 or more, and outer structure 18 could extend laterally from edge-to-edge of package 10 and also be beneath chip 14. The actual size of die attach 16 to the size of chip 14 could be balanced between at least three variables (1) sufficient ability to act as a die attach to substantially secure chip 14, (2) sufficient ability to substantially resist warpage and bowing, and (3) sufficient heat transfer "duty" to allow chip 14 to adequately reject heat to outer structure 18.

Figure 4B:

When viewing heat sink unit 36 in cross-section along the section line A—A of FIG. 4a seen in FIG. 4b, it can be seen that downset 24 is substantially continuous with outer structure 18 and die attach 16. When made by metal stamping or the like, a metal grain structure discontinuity would occur at the intersection of outer structure 18 and downset 24 and at the intersection of downset 24 and die attach 16. The grain structure discontinuity is due to the deformational effect upon heat sink unit 36 at the aforementioned intersections. Where thermal cycling may cause the grain structure discontinuity to become more pronounced, metal fatigue and/or brittle failure may occur. In order to avoid and substantially resist failure of heat sink unit 36 at the aforementioned intersections, alternative methods of formation such as ingot casting, metal powder molding, or annealing may be carried out.

Figure 5A:
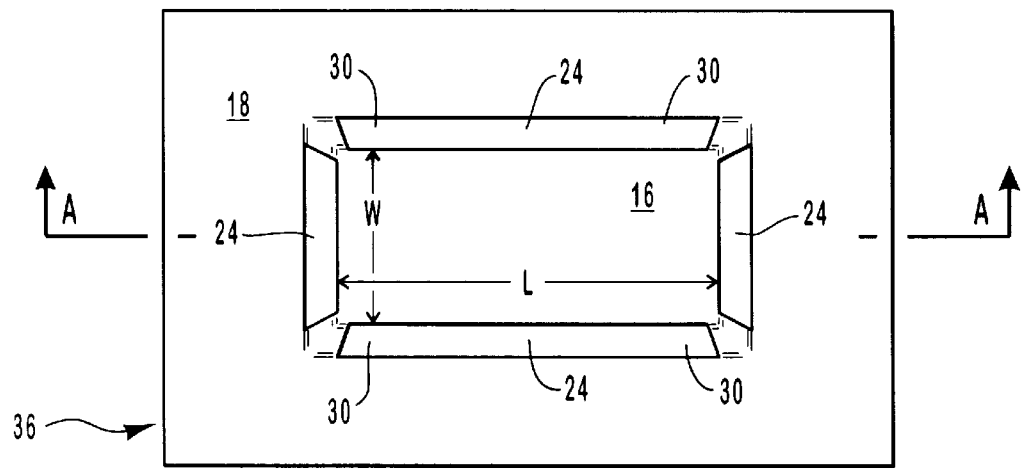
FIGS. 5a–5b illustrate an embodiment of the present invention, viewed both in plan view, FIG. 5a, and in elevational cross-section view, FIG. 5b, wherein a plurality of downsets are situated to cause a diagonal from the die attach portion to the outer structure portion.
Figure 5B:
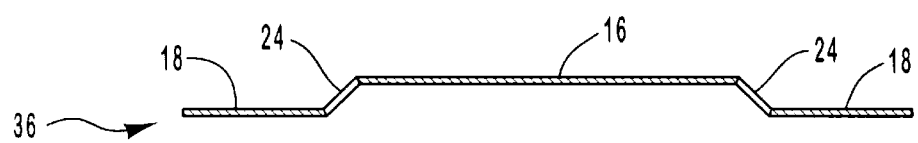

FIGS. 5a–5b illustrate an alternative embodiment of the present invention wherein heat sink unit 36 includes downset 24 that is situated at diagonals to die attach 16. It can now be appreciated that downset 24 may be substantially rectilinear, substantially diagonal, or a combination thereof. Additionally, openings 30 are not limited to rectilinear shapes but can have accurate shapes or a combination thereof. FIG. 5b illustrates a cross-sectional view of heat sink unit 36 taken along a section line A—A illustrated in FIG. 5a. Because of selection of the section line A—A, for the view of FIG. 5b, it appears that outer structure 18 and die attach 16 are connected. It is understood that heat sink unit 36 is made from a substantially unitary article.

The number of occurrences of downset 24 for a given heat sink unit 36 may be selected according to a particular application of the present invention. Where packaging plastic 26 is substantially viscous, a lower number of occurrences of downset 24 may be preferred in order to allow substantial flow of packaging plastic 26 beneath chip 14 without causing destructive deflection of downset 24 caused by substantially viscous packaging material flowing past downset 24. Where packaging plastic 26 has a substantially low viscosity during molding, the number of occurrences of downset 24 may be higher and in sufficient number to give the occurrence of downset 24 a "comb" appearance. For example, where the occurrence of downset 24 gives downset 24 a comb appearance, the occurrences of downset 24 along die attach length L may be as few as 10, preferably as many as 20, and most preferably as many as 30. The number of occurrences of downset 24 along die attach width W may be correspondingly as many as along die attach length L. In other words, the occurrence of downset 24 may have the same number per unit length along length L as per unit length along width W. Thus, if die attach length L is twice the length of die attach width W, the number of occurrences of downset 24 may be twice as many along die attach length L as along die attach width W. Alternatively, the number of occurrences of downset 24 along die attach length L may be as many as the most preferred number of thirty (30), and there may be no occurrences of downset 24 along die attach width W or vice versa.

Additionally, chip 14 may have localized occurrences of high or low heat production such that the number of occurrences of downset 24 in the regions of localized high heat production may be substantially decreased or increased relative to other regions of die attach 16 where localized heat production of chip 14 may be substantially different.

The size of downset 24 in one region may also be selected to be different from others for the same reasons. It can now be appreciated that the number or the size of downset 24, or both, may be used to facilitate localized increased heat transfer from die attach 16 to outer structure 18. Heat sink unit 36 may have at least one of opening 30. The at least one of opening 30 may comprise a plurality of openings according to the formula: openings=$S_1$ to $S_n$. Corresponding to the at least one of opening 30 at least one of downset 24 is present. The at least one of downset 24 may comprise a plurality of downsets according to the formula: downsets= $D_1$ to $D_n$, wherein opening $S_1$ defines an opening between outer structure 18, die attach 16, $D_1$, and $D_2$. Further, $S_2$ defines an opening between outer structure 18, die attach 16, $D_2$, and $D_3$, and so forth, until said $S_n$ defines an opening between outer structure 18, die attach 16, $D_n$ and $D_1$ and wherein n may be equal to 2, or may be greater than or equal to 3. In the case of a single downset $D_1$, opening $S_1$ defines an opening between outer structure 18, die attach 16, the first edge of $D_1$, and the second edge of $D_1$.

Figure 6A:
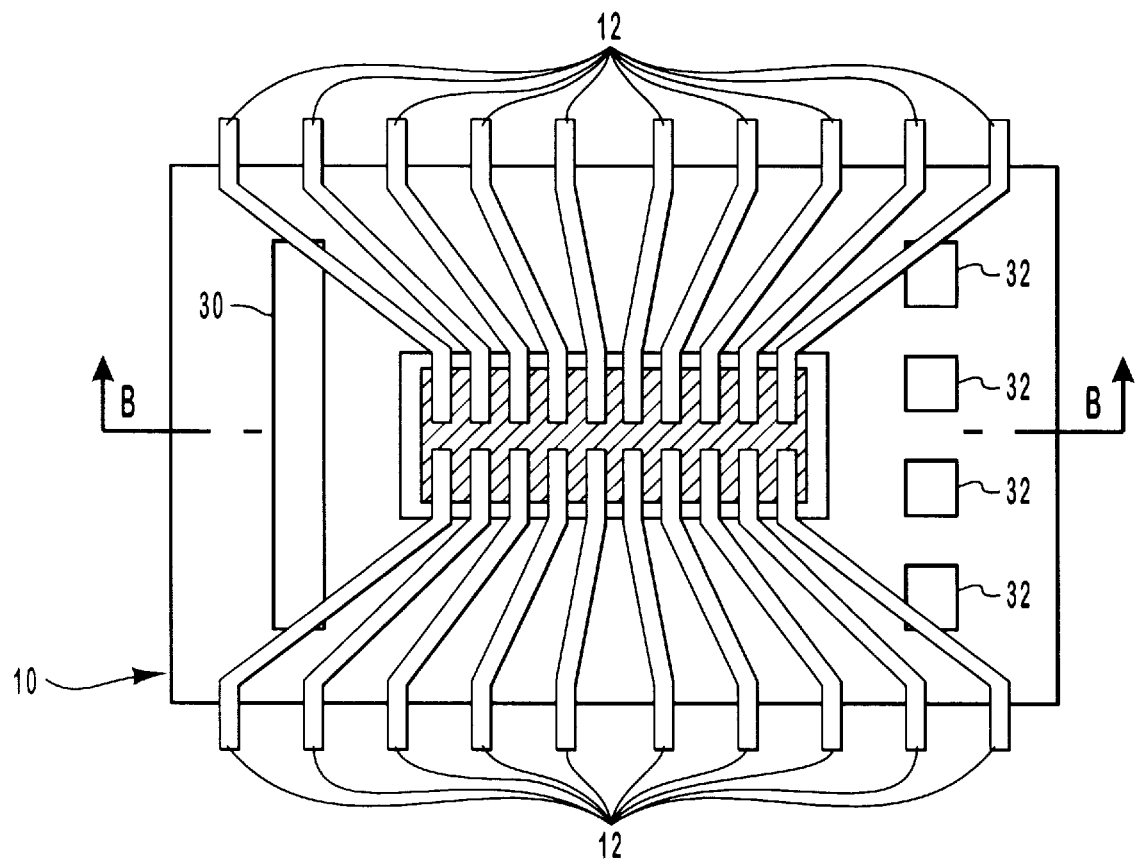
FIGS. 6a–6b illustrate an embodiment of the present invention, viewed both in plan view, FIG. 6a, and in elevational cross-section view, FIG. 6b, wherein the downsets are substantially external to the chip package after a manner that allows for increased heat transfer from the die attach portion to the outer ring portion.
Figure 6B:
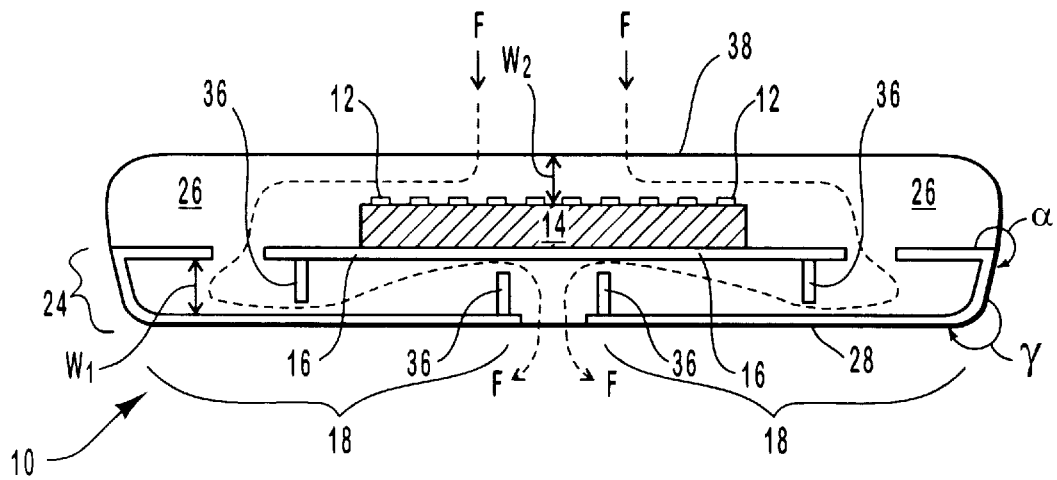

FIGS. 6a–6b illustrate yet another embodiment of the present invention. FIG. 6a is a top plan view of package 10 that is substantially laid bare analogously as illustrated in FIG. 3a along the section line B—B as depicted in FIG. 6b, and FIG. 6b is an elevational cross-section view of package 10 illustrated in FIG. 6a. In FIG. 6a, it can be seen that package 10 includes chip 14, leads on chip 12, die attach 16, first opening 30 and second openings 32. First opening 30 and second openings 32 are illustrated in the same chip package 10 as an alternative embodiment. It is understood, however, that an opening may occur both at the ends of chip 14 as a single opening such as first opening 30, as plural openings such as second openings 32, and that an opening or openings may also occur along the length of chip 14 as an opening or openings in die attach 16. In FIG. 6b, it can be seen that downset 24 comprises a part of the external boundary of package 10. In FIG. 6b, downset 24 is depicted in cross section as occurring along the sides of chip package 10 that are associated with a minor dimension or width. Increased heat rejection may be accomplished by configuring downset 24 to occur along the sides of chip package 10 that are associated with its major dimension or length.

Exposure of downset 24 to the external portion of package 10 allows chip 14 to reject additional heat in addition to the use of outer structure 18. In FIG. 6b, it can be seen that packaging plastic 26 during molding thereof will flow along the fluid flow paths F—F. Flow of packaging plastic thus goes onto chip 14, through first channel 30 or second channels 32, beneath die attach 16, and past outer structure 18.

In FIG. 6b, die attach 16 is illustrated as being a planar shape that projects substantially perpendicularly out of the plane of the page. Downset 24 forms a first angle, $\alpha$, with the plane of die attach 16, and a second angle, $\gamma$, with the plane of outer structure 18, also a planar shape that projects substantially perpendicularly out of the plane of the page. The first angle $\alpha$ is greater than 180 degrees and the second angle $\gamma$ is also greater than 180 degrees.

An example of forming a chip package is presented in which a unitary heat sink structure is provided that has a first side and a second side. The heat sink structure has at least one opening therein to communicate from the first side to the second side. An integrated circuit structure such as a chip is connected to the first side of the unitary heat sink structure to form an exposed integrated circuit package. A packaging material is next prepared, made flowable, and mobilized by positive displacement pump such as transfer injection molding. The packaging material may be selected from such materials as thermoset plastics and the like. The exposed integrated circuit package is next placed into a mold and encapsulated by packaging material, whereby the packaging material substantially covers above and to the sides of the integrated circuit structure, the packaging material substantially fills the at least one opening, and the packaging material substantially fills below the second side of the unitary heat sink structure. The packaging plastic 26 flows from the first side through the at least one opening to the second side. FIG. 6b illustrates flow of the packaging material along the fluid flow paths F—F. Baffles 36 may be used to facilitate the substantial filling of packaging plastic 26 into all spaces between die attach 16, downset 24, and outer structure 18.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A chip package comprising:
    a single piece of material that includes:
        a die attach structure;
        an outer structure surrounding said die attach structure, wherein there is at least one opening between said die attach structure and said outer structure; and
        at least one downset connecting said die attach structure and said outer structure
    a die disposed upon said die attach structure;
    a packaging material encapsulating said die, said die attach structure, and said at least one downset.
2. A chip package according to claim 1, wherein said packaging material covers one side of said outer structure.
3. A chip package according to claim 1, wherein said packaging material is selected from the group consisting of thermoset plastics.
4. A chip package according to claim 3, wherein said packaging material encapsulates said die, said die attach structure, said at least one downset, and one side of said outer structure.
5. A chip package according to claim 1, wherein said packaging material fills said at least one opening.
6. A chip package according to claim 5, wherein said packaging material encapsulates said die, said die attach structure, one side of said at least one downset, and one side of said outer structure.
7. A chip package according to claim 1, wherein said packaging material has a first thickness above said die and a second thickness beneath said die attach structure.
8. A chip package according to claim 7, wherein said first thickness is greater than said second thickness.
9. A chip package according to claim 7, wherein said first thickness is the same as said second thickness.
10. A chip package according to claim 7, wherein said first thickness is less than said second thickness.
11. A chip package according to claim 1, wherein said die attach structure has a rectangular shape.
12. A chip package according to claim 11, wherein said rectangular shape includes a first side opposite to a third side and that are the same length and a second side opposite to a fourth side and that are the same length.
13. A chip package according to claim 11, wherein said first side has a length that is greater than that of said second side.
14. A chip package according to claim 1, wherein said packaging material encapsulating said die, said die attach structure, said downset, and covering one side of said outer structure forms at least one package wall, and wherein said at least one opening is situated between said die and said at least one package wall.
15. A chip package comprising:
    a single piece of material that includes:
        a die attach structure;
        an outer structure surrounding said die attach structure, wherein there is at least one opening between said die attach structure and said outer structure; and
        at least one downset connecting said die attach structure and said outer structure
    a die disposed upon said die attach structure; and
    a packaging material composed of thermoplastics, filling said at least one opening, and forming at least one package wall, wherein said at least one opening is situated between said die and said at least one package wall, said packaging material covering one side of said of the outer structure and encapsulating said die, said die attach structure, said at least one downset.

16. A chip package according to claim 15, wherein said die attach structure has a rectangular shape in cross section.

17. A chip package according to claim 16, wherein said rectangular shape includes a first side opposite to a third side and that are the same length and a second side opposite to a fourth side and that are the same length.

18. A chip package according to claim 17, wherein said first side has a length that is greater than that of said second side.

19. A chip package according to claim 15, wherein said packaging material has a first thickness above said die and a second thickness beneath said die attach structure.

20. A chip package according to claim 19, wherein said first thickness is greater than said second thickness.

21. A chip package according to claim 19, wherein said first thickness is the same as said second thickness.

22. A chip package comprising:
- a single piece of material that includes:
  - a die attach structure having a rectangular shape in cross section that includes a first side opposite to a third side that are the same length and a second side opposite to a fourth side and that are the same length, wherein the first length is greater than the second length;
  - an outer structure surrounding said die attach structure, wherein there is at least one opening between said die attach structure and said outer structure; and
  - at least one downset connecting said die attach structure and said outer structure
- a die disposed upon said die attach structure; and
- a packaging material composed of thermoplastics, filling said at least one opening, and forming at least one package wall, wherein said at least one opening is situated between said die and said at least one package wall, said packaging material covering one side of said of the outer structure and encapsulating said die, said die attach structure, said at least one downset.

23. A chip package according to claim 21, wherein said packaging material has a first thickness above said die and a second thickness beneath said die attach structure.

24. A chip package according to claim 22, wherein said first thickness is greater than said second thickness.

25. A chip package according to claim 22, wherein said first thickness is the same as said second thickness.

26. A chip package according to claim 22, wherein said first thickness is less than said second thickness.

27. The chip package as defined in claim 1, wherein the single piece of a material has a homogeneous composition.

28. The chip package as defined in claim 1, further comprising:
- a lead frame disposed around said die.

29. The chip package as defined in claim 1, further comprising a number of leads in electrical communication with said die, wherein said at least one downset includes a number of downsets not less than the number of said leads.

30. The chip package as defined in claim 15, wherein the single piece of a material has a homogeneous composition.

31. The chip package as defined in claim 15, further comprising:
- a lead frame disposed around said die.

32. The chip package as defined in claim 15, further comprising a number of leads in electrical communication with said die, wherein said at least one downset includes a number of downsets not less than the number of said leads.

33. The chip package as defined in claim 22, wherein the single piece of a material has a homogeneous composition.

34. The chip package as defined in claim 15, further comprising:
- a lead frame disposed around said die.

35. The chip package as defined in claim 15, further comprising a number of leads in electrical communication with said die, wherein said at least one downset includes a number of downsets not less than the number of said leads.

* * * * *

UNITED STATES PATENT AND TRADEMARK OFFICE
CERTIFICATE OF CORRECTION

PATENT NO. : 6,046,496
DATED : April 4, 2000
INVENTOR(S) : David Corisis; Walter Moden It is certified that error appears in the above-identified patent and that said Letters Patent is hereby corrected as shown below:

Column 12,
Line 1: after "claim" change "21" to -- 22 --
Line 4, 6, 8: after "claim" change "22" to -- 23 --

Signed and Sealed this

Eighteenth Day of September, 2001

Attest:

NICHOLAS P. GODICI
Attesting Officer    Acting Director of the United States Patent and Trademark Office